(12) United States Patent
Meier et al.

(10) Patent No.: US 10,571,681 B2
(45) Date of Patent: Feb. 25, 2020

(54) MEMBRANE STRUCTURES FOR MICROELECTROMECHANICAL PIXEL AND DISPLAY DEVICES AND SYSTEMS, AND METHODS FOR FORMING MEMBRANE STRUCTURES AND RELATED DEVICES

(71) Applicant: Infineon Technologies AG, Neubiberg (DE)

(72) Inventors: Roland Meier, Regensburg (DE); Klemens Pruegl, Regensburg (DE); Bernhard Winkler, Regensburg (DE); Thomas Popp, Falkenstein (DE); Raimund Foerg, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 144 days.

(21) Appl. No.: 15/682,671

(22) Filed: Aug. 22, 2017

(65) Prior Publication Data
US 2017/0371148 A1 Dec. 28, 2017

Related U.S. Application Data

(62) Division of application No. 14/722,552, filed on May 27, 2015, now Pat. No. 9,798,132.

(60) Provisional application No. 62/013,170, filed on Jun. 17, 2014.

(51) Int. Cl.
*G02B 26/00* (2006.01)
*B81C 1/00* (2006.01)

(52) U.S. Cl.
CPC ........ *G02B 26/001* (2013.01); *B81C 1/00158* (2013.01); *B81C 1/00539* (2013.01); *G02B 26/007* (2013.01)

(58) Field of Classification Search
CPC ................ G02B 26/001; G02B 26/007; B81C 1/00158; B81C 1/00539
USPC ............ 359/221.2, 198.1, 200.6–200.8, 230, 359/224.1, 290, 291, 292, 298, 846, 847,
(Continued)

(56) References Cited

U.S. PATENT DOCUMENTS 4,317,126 A * 2/1982 Gragg, Jr. ............... H01L 29/84
257/419
6,147,789 A 11/2000 Gelbart
(Continued)

FOREIGN PATENT DOCUMENTS

CN 1591093 A 3/2005

OTHER PUBLICATIONS

Notice of Allowance dated Jul. 3, 2017 for U.S. Appl. No. 14/722,552.

*Primary Examiner* — Jennifer D. Carruth
(74) *Attorney, Agent, or Firm* — Eschweiler & Potashnik, LLC

(57) ABSTRACT

Embodiments relate to microelectromechanical systems (MEMS) and more particularly to membrane structures comprising pixels for use in, e.g., display devices. In embodiments, a membrane structure comprises a monocrystalline silicon membrane above a cavity formed over a silicon substrate. The membrane structure can comprise a light interference structure that, depending upon a variable distance between the membrane and the substrate, transmits or reflects different wavelengths of light. Related devices, systems and methods are also disclosed.

20 Claims, 6 Drawing Sheets

(58) Field of Classification Search
USPC ........ 359/850, 852, 855; 257/414–416, 419; 438/29, 53, 689, 705; 381/122
See application file for complete search history.

(56) References Cited

U.S. PATENT DOCUMENTS

| | | | | |
|---|---|---|---|---|
| 7,824,943 | B2* | 11/2010 | Lutz | B81B 3/0021 |
| | | | | 257/E21.192 |
| 7,872,789 | B2 | 1/2011 | Sendo | |
| 9,057,872 | B2 | 6/2015 | Mignard et al. | |
| 9,162,876 | B2* | 10/2015 | Corona | B81C 1/00158 |
| 2002/0191802 | A1* | 12/2002 | Choe | H04R 23/00 |
| | | | | 381/92 |
| 2004/0163476 | A1 | 8/2004 | Partridge et al. | |
| 2005/0260783 | A1* | 11/2005 | Lutz | B81B 3/0005 |
| | | | | 438/51 |
| 2006/0077531 | A1* | 4/2006 | Novotny | B81C 1/00246 |
| | | | | 359/291 |
| 2006/0278942 | A1* | 12/2006 | Rubel | B81B 3/0005 |
| | | | | 257/415 |
| 2008/0237756 | A1* | 10/2008 | Partridge | B81C 1/00333 |
| | | | | 257/415 |
| 2011/0169724 | A1 | 7/2011 | Tao et al. | |
| 2012/0175714 | A1* | 7/2012 | Lakamraju | G01L 19/083 |
| | | | | 257/415 |
| 2012/0235254 | A1* | 9/2012 | Mohanakrishnaswamy | |
| | | | | B81C 1/00246 |
| | | | | 257/415 |
| 2012/0237061 | A1* | 9/2012 | Corona | B81C 1/00158 |
| | | | | 381/122 |
| 2013/0056751 | A1* | 3/2013 | Ziaei | B81C 1/00246 |
| | | | | 257/76 |
| 2013/0328142 | A1* | 12/2013 | Nackaerts | H01L 29/84 |
| | | | | 257/415 |
| 2014/0208857 | A1 | 7/2014 | Phan Le et al. | |
| 2014/0264647 | A1* | 9/2014 | Katragadda | B81C 1/00238 |
| | | | | 257/415 |
| 2016/0037261 | A1* | 2/2016 | Harrington | B32B 9/04 |
| | | | | 257/416 |
| 2016/0157025 | A1* | 6/2016 | Miles | H04R 19/04 |
| | | | | 257/416 |

* cited by examiner

MEMBRANE STRUCTURES FOR MICROELECTROMECHANICAL PIXEL AND DISPLAY DEVICES AND SYSTEMS, AND METHODS FOR FORMING MEMBRANE STRUCTURES AND RELATED DEVICES

REFERENCE TO RELATED APPLICATIONS

This application is a divisional of U.S. application Ser. No. 14/722,552 filed on May 27, 2015, which claims priority to U.S. Provisional Application No. 62/013,170 filed on Jun. 17, 2014, the contents of which are herein incorporated by reference in their entirety.

TECHNICAL FIELD

Embodiments relate to microelectromechanical systems (MEMS) and more particularly to membrane structures comprising pixels for use in, e.g., display devices.

BACKGROUND

Microelectromechanical systems (MEMS) are used in a variety of situations and applications. MEMS can be very small, such as having lateral dimensions in a range of 0.02 to 1.0 mm, and can be used in many applications including sensing (e.g., pressure sensors, gyroscopes, accelerometers, etc.), actuating, switching and others. Commercial applications of MEMS include ink jet printers, automobile airbag systems, microphones, and others, including displays.

Conventional MEMS used in displays typically comprise moveable conductive membranes that can form individual pixels or arrays in flat-panel displays. The moveable membranes are formed by etching or otherwise removing a sacrificial layer of covered silicon oxide from the structure, thereby forming a cavity and releasing at least a portion of the membrane from the underlying substrate so that the membrane can move and flex in operation. There are several drawbacks associated with this technique and the use of silicon oxide, including: the ability to integrate the MEMS in other systems and manufacturing processes; the achievable quality and selectivity of the etching of the sacrificial layer; and cost and overall complexity.

Other conventional display technologies include use digital light processing (DLP) and liquid crystal on silicon (LCOS). DLP techniques comprise arrays of tiny mirrors that are switched or tilted electrostatically to direct light in different directions. Additional lenses and light absorbers are necessary to remove or contain undesired light and form an image. In LCOS, liquid crystals are applied to silicon chips, though it is difficult to seal the liquid in a cavity between silicon chips and bond them, making these techniques more complicated and expensive.

Thus, there is a need for improved display technologies.

SUMMARY

Embodiments relate to microelectromechanical systems (MEMS) and more particularly to membrane structures comprising pixels for use in, e.g., display devices.

In an embodiment, a microelectromechanical (MEMS) device comprises a substrate comprising semiconductor material; a membrane comprising semiconductor material; at least one anchor structure coupled to the membrane and configured to enable the membrane to move relative to the substrate; and a cavity separating the membrane from the substrate by a gap distance that changes as the membrane moves relative to the substrate, wherein a portion of a light beam incident on the membrane is reflected or transmitted by the MEMS device dependent on the gap distance.

In an embodiment, a method of forming a microelectromechanical (MEMS) device comprises providing a semiconductor substrate; forming a sacrificial layer comprising a semiconductor material on the substrate; forming a monocrystalline semiconductor membrane layer on the sacrificial layer; forming at least one etching aperture in the silicon membrane layer; removing the sacrificial layer via the at least one etching aperture; and closing the at least one etching aperture, wherein forming a sacrificial layer, forming a monocrystalline semiconductor membrane layer, forming at least one etching aperture, and removing the sacrificial layer are carried out in a temperature range of about 500 degrees Celsius to about 800 degrees Celsius.

BRIEF DESCRIPTION OF THE DRAWINGS

The disclosure may be more completely understood in consideration of the following detailed description of various embodiments in connection with the accompanying drawings, in which.

Figure 1:
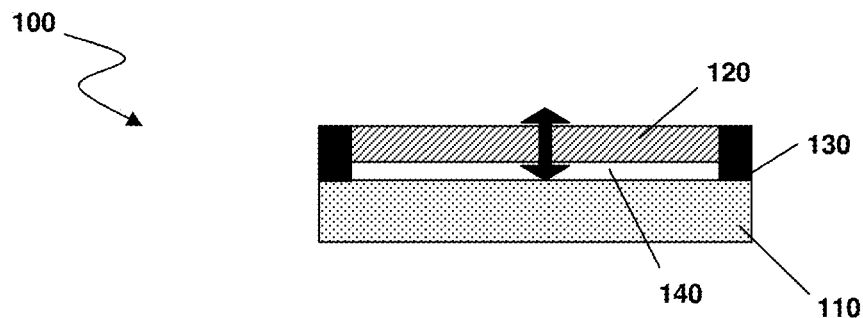
FIG. 1 is a side cross-sectional view of a membrane structure according to an embodiment.

While this disclosure is amenable to various modifications and alternative forms, specifics thereof have been shown by way of example in the drawings and will be described in detail. It should be understood, however, that the intention is not to limit this disclosure to the particular embodiments described. On the contrary, the intention is to cover all modifications, equivalents, and alternatives falling within the spirit and scope of this disclosure as defined by the appended claims.

DETAILED DESCRIPTION

Embodiments relate to microelectromechanical systems (MEMS) and more particularly to membrane structures comprising pixels for use in, e.g., display devices. In embodiments, a membrane structure comprises a monocrystalline silicon membrane above a cavity formed over a silicon substrate. The membrane structure can comprise a light interference structure that, depending upon a variable distance between the membrane and the substrate, transmits or reflects different wavelengths of light.

In one example application, a plurality of the membrane structures can be assembled in an array to form a display device. Each membrane structure of the array can comprise an individual pixel, and an activity state or color of each pixel can be varied or changed by applying a voltage, current, electric field and/or magnetic field to vary or change the distance between the membrane and the substrate of that pixel.

Embodiments also relate to methods of forming the membrane structures and/or arrays of membrane structures. In one embodiment, a silicon substrate is provided, and a silicon germanium (SiGe) layer is epitaxially grown thereon. A silicon layer, such as a monocrystalline silicon layer, can be deposited on the SiGe layer. The SiGe layer can be selectively etched or otherwise removed to form a cavity between the monocrystalline silicon layer, which becomes the movable membrane, and the underlying silicon substrate.

FIG. 1 depicts a membrane structure 100 according to an embodiment. Membrane structure 100 comprises a substrate 110, a membrane 120, an anchor structure 130 and a cavity 140. In embodiments, substrate 110 comprises a semiconductor material, such as silicon or a silicon-on-insulator (SOI) structure. Membrane 120 also comprises a semiconductor material in embodiments, such as silicon, for example monocrystalline silicon. Substrate 110 and/or cavity 140 can comprise other materials in still other embodiments.

Figure 2:
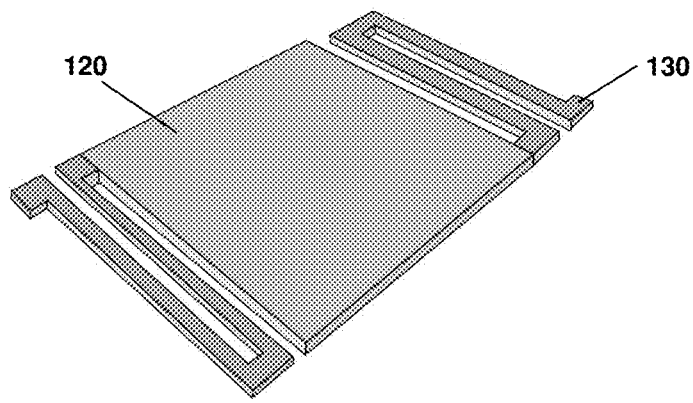
FIG. 2 is a perspective view of a membrane and anchor structure according to an embodiment.

Though depicted separately in FIGS. 1 and 2 for purposes of illustration only, anchor structure 130 can be separate from or integrally formed with membrane 120 in embodiments. Thus, anchor structure 130, like membrane 120, can comprise a semiconductor material in embodiments, such as silicon, for example monocrystalline silicon, in embodiments, or anchor structure 130 can comprise some other material, for example in order to provide an insulating effect in operation when a charge is applied to membrane 120. In still other embodiments, membrane 120 and/or anchor structure 130 can comprise an insulating material, region or element, such as between membrane 120 and a portion of anchor structure 130, or at an end portion of anchor structure remote from membrane 120 comprising a different material or a differently doped material, in order to prevent charge transmission. In yet another embodiment, anchor structure 130 is coupled with an insulating structure between it and an adjacent structure or device.

One example of anchor structure 130 is depicted in FIG. 2. In this example, membrane 120 comprises or is coupled with at least two anchor structures 130 comprising springs. Anchor structures 130 can be arranged on opposing sides of membrane 120, coupled to diagonally opposite corners or portions of membrane 120. In other embodiments, anchor structures 130 can be coupled at different points of membrane 120 (e.g., closer to the midpoints, at multiple points, along an entire edge or side, etc.) and comprise more or fewer, or longer or shorter, spring meanders. In still other embodiments, four anchor structures 130 can be used, one on each corner and/or side of membrane 120. The particular number, arrangement and structure of anchor structures 130 can be chosen in any particular embodiment to provide a desired or necessary movement of membrane 120 with respect to substrate 110, to accommodate a particular voltage, current, electric field and/or magnetic field or other quantity to be applied, or to conform with or meet some other characteristic or quality.

An advantage of anchor structure 130 is providing movement of the entire membrane 120 in operation, such that membrane 120 and substrate 110 remain in a generally parallel orientation with respect to one another as the distance between them (cavity 140) varies. In some conventional MEMS devices, like pressure sensors, only the center portion of the membrane moves or flexes (or moves or flexes the most), while movement or flexion is increasingly limited closer to the sides or edges of membrane 120.

Figure 3:
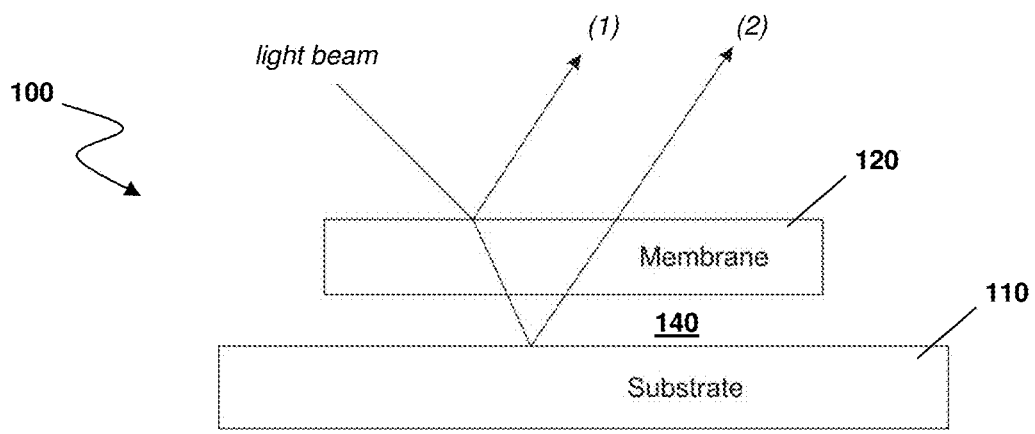
FIG. 3 is a diagram of a light beam incident on a membrane structure according to an embodiment.

In embodiments, and referring to FIG. 3, membrane structure 100 comprises an interference structure that reflects or transmits certain wavelengths of light. The significant difference between the refraction index of silicon (about 3-4), and air (about 1) enables good interference by membrane structure 100. A light beam incident on membrane structure 100 will have a portion (1) that is reflected by membrane 120 and a portion (2) that is transmitted by membrane 120 to cavity 140 and substrate 110 and reflected by substrate 110. In operation, a path length of the second transmitted portion can be changed by varying the distance between membrane 120 and substrate 110, which can change the brightness and/or color of the transmitted light.

Membrane structure 100 therefore can reflect the light beam, transmit the light beam, or reflect a portion and transmit a portion, which can be controlled by changing the distance between membrane 120 and substrate 110. The intensity of the light beam, if reflected, can depend on how much of the light beam is transmitted. The color of the light beam can depend on the wavelength of the light that is transmitted. The wavelength of visible light is about 400 nm to about 700 nm, producing violet light at the shorter wavelengths, then blue, green, yellow, and orange, up to red at the longer wavelengths. Longer wavelength light passes through silicon more easily, such that red is easier to produce. Silicon tends to absorb shorter wavelength light, such that it is more difficult to transmit. Thus, blue and violet are more difficult to produce.

The dimensions of membrane 120 also can affect the degree to which light is transmitted. In embodiments, membrane 110 is at least about 200 nanometers (nm) thick, such as about 400 nm in one embodiment. Cavity 140 can be formed to provide a gap of at least about 50 nm, such as about 300 nm in one embodiment, when membrane 120 is in a neutral position relative to substrate 110 (i.e., no charge or force is being applied to cause membrane 120 to move). This gap distance is the dimension that changes as membrane 120 is attracted to (gap decreases) or repelled from (gap increases) substrate 110 in operation and in turn determines the change in interference. In embodiments, the gap distance is in the range of the wavelength (e.g., about several hundred nanometers), and larger gap distances can be achieved in different ways in various embodiments (e.g., by etching a sacrificial layer and then performing an isotropic etch on the underlying silicon), with example methods, processes and/or techniques for forming membrane structure 100 and related devices discussed in more detail below.

In operation, the gap distance between membrane 120 and substrate 110 can be varied by applying a voltage, current, electric field, electrostatic force, electromagnetic force, magnetic field or other physical quantity to one or both of membrane 120 and substrate 110. For example, applying a voltage of the same polarity to membrane 120 and substrate 110 can cause them to repel one another, increasing the gap distance. Conversely, applying voltages of different polarities to each membrane 120 and substrate 110 can cause them to be attracted to one another, reducing the gap distance. In another embodiment, magnetic materials can be applied to or embedded in one or both of membrane 120 and substrate 110, such that a magnetic field or electromagnetic force can cause membrane 120 and substrate 110 to be attracted or repelled.

Figure 4:
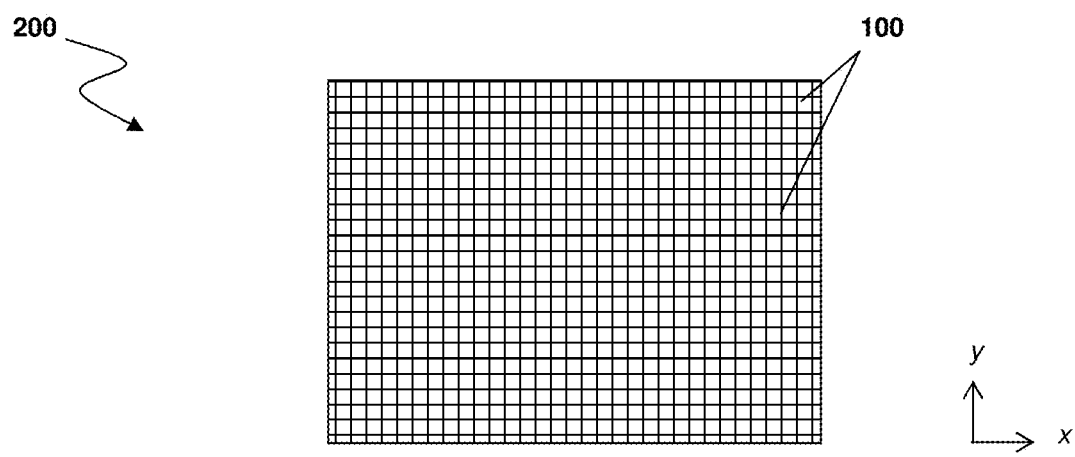
FIG. 4 is a top view of an array of pixels according to an embodiment.

Using these principles, display and other devices can be formed by assembling arrays of membrane structures 100. One array 200 is depicted in FIG. 4. Array 200 can comprise tens, hundreds, thousands or more of individual membrane structures 100, with each membrane structure 100 forming a single pixel of the display. The size of each pixel can vary in embodiments, such as from about 10 μm to about 200 μm or more. Pixel size can vary according to an application or device, with a pixel size of, e.g., about 20 μm being suitable in some eyeglass applications while a larger pixel size of, e.g., about 100 μm or about 200 μm can be suitable for mobile phones, tablets and other handheld devices. Array 200 can comprise a single contiguous substrate structure with differently doped regions defining a portion of substrate 110 corresponding to a particular membrane structure 100 (i.e., pixel). The particular xy arrangement of pixels also can vary. Each individual pixel can be controlled (e.g., by applying voltage, current, electric field, magnetic field, electromagnetic force, etc., as discussed above) independently to operate the display. The light reflected by the membrane structures 100 can be projected to a projection surface such as a screen or a wall to display an image or video. Thus, the display can be a full-color display by controlling individual pixels to produce different colors, or the display can be single-color display, in which pixels are either on (e.g., red, blue or green, etc.) or off (black). This can be seen, for example, in the color change in FIG. 5.

For example, in one embodiment each pixel (e.g., membrane structure 100 comprising a membrane 120 and a region of substrate 110 below that membrane 120) is coupled to a signal line to apply an electrical charge to each pixel. Membranes 120 can be coupled with horizontal signal lines and the corresponding substrate areas with vertical signal lines (or vice-versa), with at least a diode or other element coupled between the signal line and each pixel to enable each pixel to be addressed or operated individually (i.e., the particular diodes associated with a pixel can be turned on so that that pixel, rather than the one next to it, can be coupled to the signal line for operation). Each pixel also can be coupled with a transistor in substrate 110 to reduce the current and voltage on each signal line. One skilled in the art will appreciate that additional circuitry and circuit elements also can be included in the display in various embodiments.

As previously discussed, applying the same polarity of charge to membrane 120 and on the region of substrate 110 below that membrane, corresponding to a single membrane structure 100 and pixel, results in a repulsive force and therefore an increased gap distance between membrane 120 and substrate 110. Applying opposing polarities reduces the gap distance between substrate 110 and membrane 120. Anchor structures 130 of each membrane 120 mechanically couple the membrane to the wafer, with their spring force in balance with the electrical or other applied force. The reflected light on the surface of membrane 120 interferes with the reflected light from substrate 110, and an applied voltage to a pixel modulates the gap distance between membrane 120 and substrate 110 and therefore the length of the optical path, which provides a different interference and color. In embodiments, an additional color filter (e.g., red, green, blue or some other color) above each pixel provides a full color display.

Membrane structures 100, array 200 and/or display devices comprising one or more membrane structures 100 or arrays 200 can be formed according to a variety of different methods, processes and techniques. One example process 300 will be discussed with reference to FIGS. 6 and 7A-7J, though other processes can be used in other embodiments to form membrane structures 100, arrays 200 and/or display devices in the same way that other structures and devices can be formed by this example process in other embodiments.

Figure 7A:
FIGS. 7A-7J are side cross-sectional views of a process of forming a pixel according to an embodiment.

In FIG. 7A and at 310, a substrate 410 is provided. Substrate 410 can comprise a wafer, such as a semiconductor wafer comprising silicon, a SOI structure or some other suitable substrate.

Figure 7B:
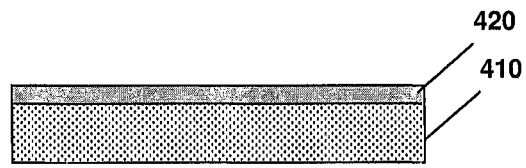

In FIG. 7B and at 320, a sacrificial layer 420 is formed on substrate 410. In one embodiment, sacrificial layer 420 comprises SiGe formed by epitaxial growth on substrate 410, though sacrificial layer 420 can comprise other materials or be formed in other ways in other embodiments. For example, sacrificial layer 420 can comprise other compound semiconductor material formed by epitaxial growth. In some embodiments, the compound material comprises at least the semiconductor material of the substrate 410. In one embodiment, sacrificial layer 420 comprises about 70% Si and about 30% Ge, though these percentages can vary in other embodiments. Advantageously, the Ge portion of sacrificial layer 420 is largely free of dislocations, which can provide improved removal (e.g., by etching) of sacrificial layer 420, discussed in more detail below. Sacrificial layer 420 is at least 20 nm thick in embodiments, such as about 50 nm thick in one embodiment. Sacrificial layer 420 can be thinner or thicker in other embodiments though generally is thick enough to provide a sufficient cavity height or gap distance in embodiments.

Figure 7C:
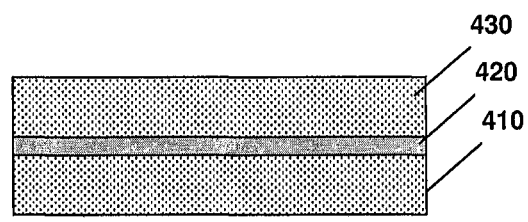

In FIG. 7C and at 330, a membrane layer 430 is formed on sacrificial layer 420. In one embodiment, membrane layer 430 comprises Si, such as monocrystalline Si, formed by epitaxial growth on sacrificial layer 420, though membrane layer 430 can comprise other materials or be formed in other ways in other embodiments. Membrane layer 430 can be thinner or thicker in other embodiments though generally is thick enough to provide sufficient stability of the membrane in operation and use.

Figure 7D:
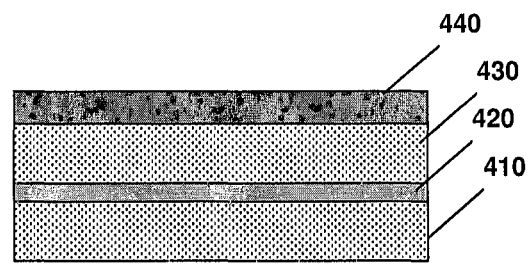
Figure 7E:
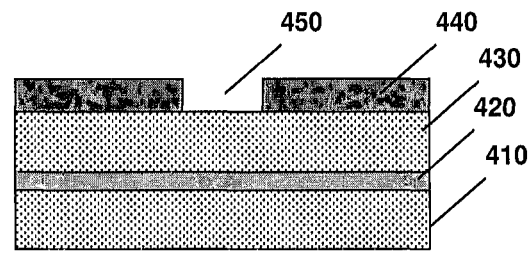
Figure 7F:
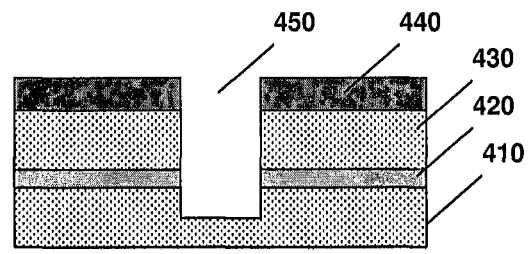
Figure 7G:
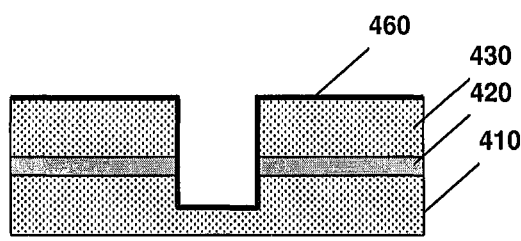
Figure 7H:
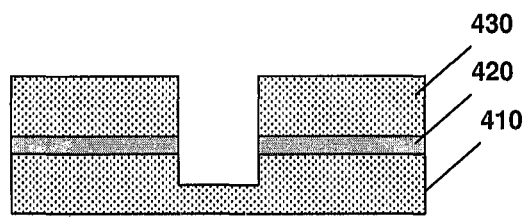

In FIGS. 7D-7H and at 340, an etching aperture matrix is formed. A single etching aperture is depicted in FIGS. 7D-7H, but many a plurality of etching apertures can be formed for an individual membrane structure, array or display device. In FIG. 7D, a mask layer 440 is applied. Mask layer 440 can comprise a silicon hard mask in formed by, e.g., a tetra-ethyl ortho silicate (TEOS) method one embodiment or another type of mask and/or formed by some other suitable method in other embodiments. In FIG. 7E, a lithography step, such as photolithography (e.g., deep ultraviolet, DUV), and an etching step (e.g., anisotropic oxide etching) form the etching aperture matrix 450 in mask layer 440. In FIG. 7F, the etching aperture matrix 450 pattern is transferred (e.g., by anisotropic etching) to membrane layer 430, such that etching aperture matrix 450 extends to and through sacrificial layer 420 to substrate 410. Each etching aperture can have a diameter of about 0.05 micrometers (μm) to about 6 μm or more, such as about 0.35 micrometers in one embodiment. Adjacent etching apertures can be spaced apart from one another by about 1 μm to about 10 μm or more, such as about 3 μm center-to-center in one embodiment. In FIG. 7G, mask layer 440 is removed, and in FIG. 7H a native oxide layer 460 is removed.

Figure 7I:
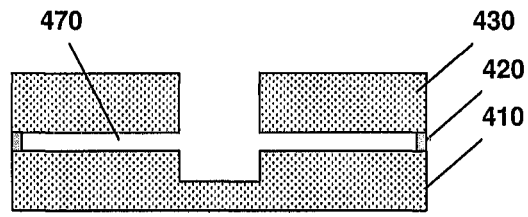

In FIG. 7I and at 350, sacrificial layer 420 is removed to form a cavity 470. In embodiments, this can be done by etching, such as by using a hydrogen chloride (HCl) or plasma cavity etch process in one embodiment.

Figure 7J:
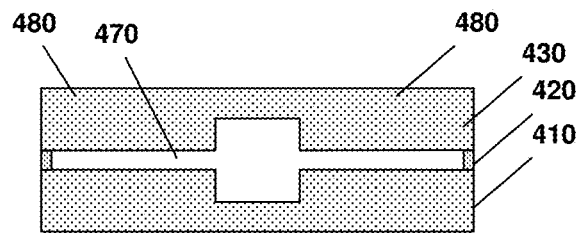

In FIG. 7J and at 360, additional processing can be carried out, such as to close etching aperture matrix 450 and forming anchor structures for individual membranes 480.

In embodiments, advantages and improved performance can be realized, at least in part, through various controls and features of process 300. For example, in embodiments etching of sacrificial layer 420 can be improved by providing temperature controls in process 300. In one embodiment, the temperature of the wafer (e.g., substrate 410) is maintained between about 500 degrees C. and about 800 degrees C., such as between about 700 degrees C. and about 800 degrees C., such as at about 750 degrees C. in one embodiment. This can provide an improved etching rate (at, e.g., 350 of an SiGe sacrificial layer 420) and enhanced selectivity, where the selectivity is the ratio of the difference between the SiGe etching rate and Si etching rate to the Si etching rate:

$$\frac{[\text{SiGe etching rate}] - [\text{Si etching rate}]}{\text{Si etching rate}}$$

These improvements may be related to mechanical strain on the SiGe layer at an atomic level, which can result from a slight mismatch between the atomic Si and SiGe crystal lattices during "cold" growth (thermodynamic imbalance). Heating reduces the energetic activation threshold of lattice relaxation processes and thus increases the probability or rate thereof. This relaxation reduces the largest strain gradients as a result of the generation of local dislocations and furthermore reduces the chemical reaction rate of the etching gas (e.g., HCl) or approximates it to that of the predominant Si lattice. As typical processing is carried out at or greater than 800 degrees C., embodiments discussed herein carried out at lower temperatures provide advantages and improvements otherwise not realizable.

Additionally, the etching rate of silicon oxide (SiO) by HCl typically is very low compared with Si and SiGe, which has the effect that even oxide layers having a thickness of only a few nanometers between the sacrificial SiGe layer (420) and the etching medium can prevent etching or delay the start of etching for some time. Therefore, shortly before the HCl etching (350), native oxide layer 460 is removed and subsequently the exposed SiGe surfaces (e.g., within etching aperture matrix 450) are kept free of oxide by saturation with hydrogen until the start of the etching process at 350. In the case of SiGe surfaces that have been stored for a relatively long time, the etching may start with a time delay of about 20 minutes, with oxide residues or bridges nevertheless still remaining even after ongoing etching. In these situations, a hydrofluoric (HF) dip and a time coupling of about 2 hours can be sufficient for a successful SiGe etching process using HCl.

Figure 5:
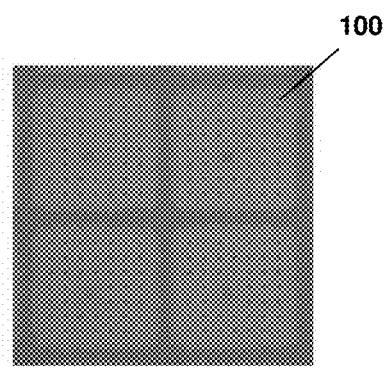
FIG. 5 is a top view of a display device according to an embodiment.
Figure 6:
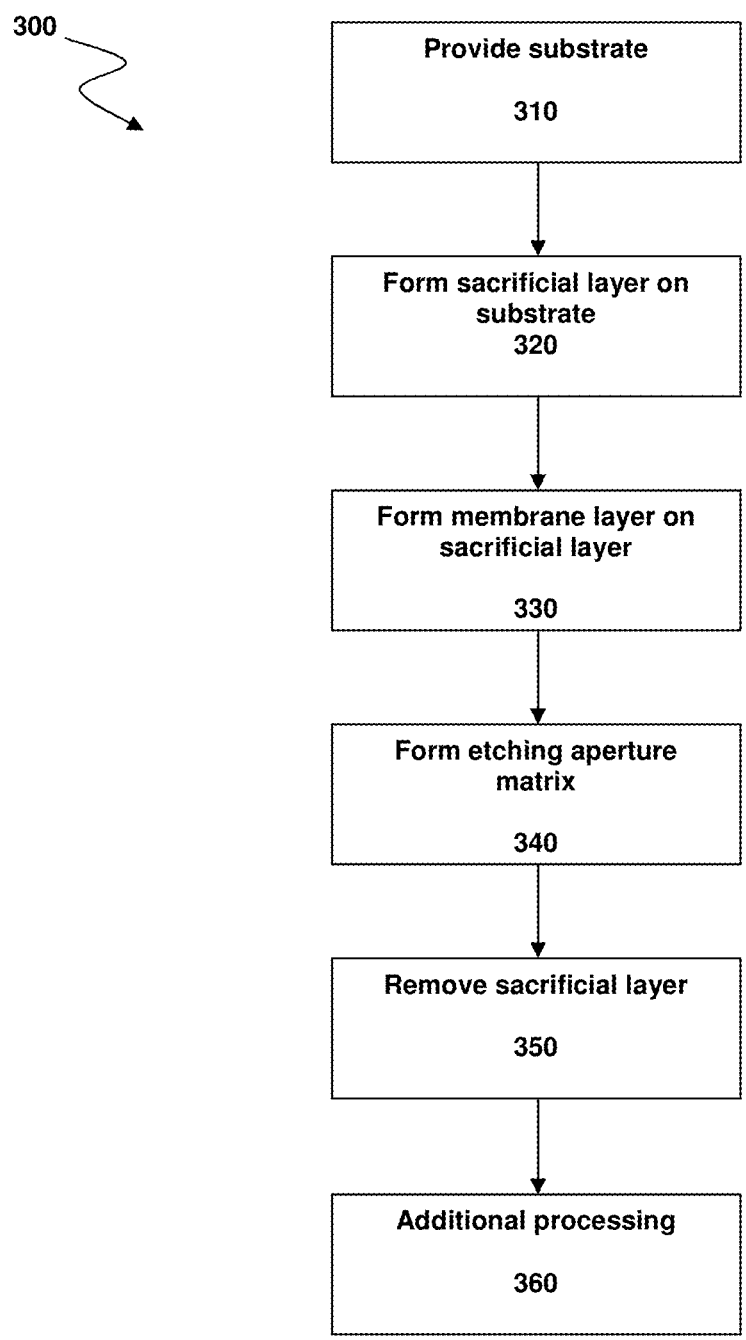
FIG. 6 is a flowchart of a process according to an embodiment.
Figure 8:
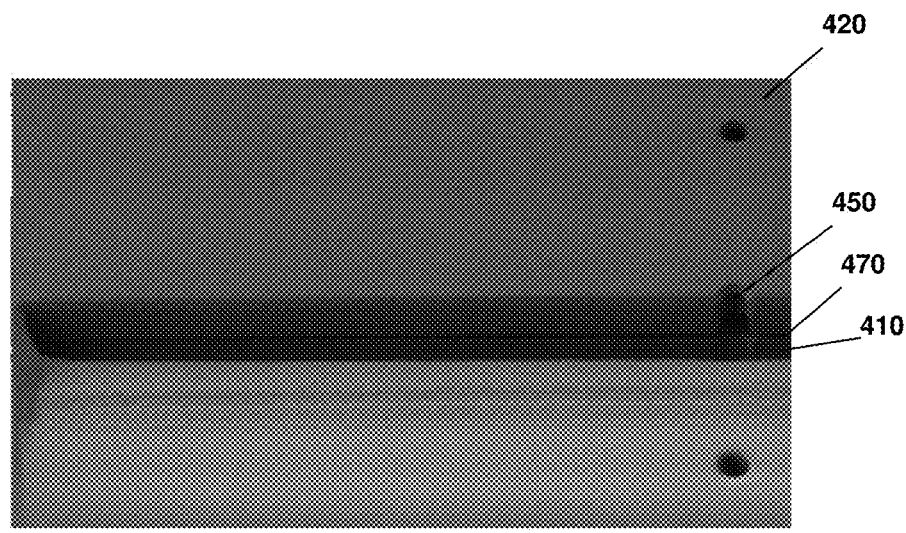
FIG. 8 is a perspective view of an experimental pixel according to an embodiment.

Thus, and referring to the electron microscopy cross-section of FIG. 8 and top view of FIG. 5 from which the following quantities were experimentally measured (i.e., with the aid of optical evaluation of the vertical Si etching width at the start of the cavity and the lateral SiGe etching width at the end of the cavity), in embodiments in which the temperature and other controls are implemented, etching selectivities of about 300 or more and undercut ranges of much greater than about 10 micrometers (µm) have been achieved.

Primarily in epitaxy, achieving economic growth rates typically requires high temperatures (which are impermissibly high, however, for the subsequent selective etching as discussed above). If low temperature limits are complied with, the process time for epitaxy increases such that it is unsuitable for economic manufacturing. In order to avoid this dilemma, however, it is possible in embodiments to carry out only an Si epitaxy with a correspondingly thinner Si layer at sufficiently low temperatures, in order to save process time, and then to produce the final layer thickness by a further high-temperature epitaxy only after the cavity etching.

Even for process temperatures of about 600 degrees C. to about 700 degrees C., process pressures of less than about 100 Torr (133 hPa), and an associated SiGe etching rates of less than about 0.2 µm/min, excessively long occupancy times at the epitaxy installations and thus disproportionately high process costs can occur. Nevertheless, by optimizing the process parameters of temperature (e.g., at about 750 degrees C.) and pressure (about 600 Torr), a significant increase in the etching rate can be achieved for the same selectivity. The process costs for the cavity etching can be calculated, in embodiments, to be reduced to approximately one-third. In general, lower pressures provide lower etching rates, so a relatively high pressure (e.g., 600 Torr) can be advantageous in embodiments.

Embodiments thereby provide MEMS membrane structures that can form pixels in a display array or device. Embodiments also provide membrane arrays, systems and display devices, as well as methods and processes for forming membrane arrays, systems and display devices.

Various embodiments of systems, devices and methods have been described herein. These embodiments are given only by way of example and are not intended to limit the scope of this disclosure. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of this disclosure.

Persons of ordinary skill in the relevant arts will recognize that this disclosure may comprise fewer features than illustrated in any individual embodiment described above. The embodiments described herein are not meant to be an exhaustive presentation of the ways in which the various features of this disclosure may be combined. Accordingly, the embodiments are not mutually exclusive combinations of features; rather, this disclosure can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method of forming a microelectromechanical (MEMS) device comprising:
   providing a semiconductor substrate;
   forming a sacrificial layer comprising a semiconductor material on the substrate;
   forming a monocrystalline semiconductor membrane layer on the sacrificial layer;
   forming at least one etching aperture in the monocrystalline semiconductor membrane layer;
   removing the sacrificial layer via the at least one etching aperture; and
   closing the at least one etching aperture,
   wherein forming a sacrificial layer, forming a monocrystalline semiconductor membrane layer, forming at least one etching aperture, and removing the sacrificial layer are carried out in a temperature range of about 500 degrees Celsius to about 800 degrees Celsius.

2. The method of claim 1, wherein removing the sacrificial layer further comprises using hydrogen chloride.

3. The method of claim 1, wherein forming a monocrystalline semiconductor membrane layer further comprises forming a monocrystalline silicon membrane, and wherein forming a sacrificial layer comprises forming a layer of silicon germanium.

4. The method of claim 1, further comprising removing a native oxide layer before removing the sacrificial layer.

5. The method of claim 1, wherein the temperature range is about 700 degrees Celsius to about 800 degrees Celsius.

6. The method according to claim 1, wherein the sacrificial layer comprises a compound semiconductor material.

7. The method according to claim 1, wherein the sacrificial layer comprises silicon germanium.

8. A method of forming a microelectromechanical (MEMS) device comprising:
   providing a semiconductor substrate;
   forming a sacrificial layer comprising a semiconductor material on the substrate;
   forming a semiconductor membrane layer on the sacrificial layer;
   forming at least one etching aperture in the semiconductor membrane layer and in the sacrificial layer;
   removing the sacrificial layer via the at least one etching aperture; and
   closing the at least one etching aperture.

9. The method of claim 8, wherein removing the sacrificial layer is carried out in a temperature range of about 500 degrees Celsius to about 800 degrees Celsius.

10. The method of claim 8, wherein forming the at least one etching aperture in the semiconductor membrane layer comprises forming the at least one etching aperture in a temperature range of about 500 degrees Celsius to about 800 degrees Celsius.

11. The method of claim 8, wherein at least one of forming a sacrificial layer, forming a monocrystalline semiconductor membrane layer, forming at least one etching aperture, and removing the sacrificial layer is carried out in a temperature range of about 500 degrees Celsius to about 800 degrees Celsius.

12. The method of claim 8, wherein removing the sacrificial layer further comprises using hydrochloric acid (HCl).

13. The method of claim 8, wherein forming a semiconductor membrane layer further comprises forming a monocrystalline silicon membrane, and wherein forming a sacrificial layer comprises forming a layer of silicon germanium.

14. The method of claim 8, further comprising, after forming the at least one etching aperture in the membrane layer, removing a native oxide layer in the at least one etching aperture before removing the sacrificial layer.

15. The method of claim 14, wherein removing the native oxide layer comprises exposing the native oxide layer to hydrofluoric acid (HF).

16. The method of claim 15, further comprising immersing the at least one etching aperture in a hydrogen atmosphere until the removing of the sacrificial layer.

17. The method according to claim 16, wherein the sacrificial layer comprises silicon germanium, and wherein removing the sacrificial layer comprises etching with HCl.

18. The method according to claim 17, further comprising again exposing the at least one etching aperture to hydrofluoric acid (HF) prior to removing the sacrificial layer if the semiconductor substrate has been stored after the etching of the at least one etching aperture and native oxide removal for a period of two hours or more.

19. The method according to claim 8, wherein the sacrificial layer comprises a compound semiconductor material.

20. The method according to claim 8, wherein removing the sacrificial layer comprises removing most of the sacrificial layer extending from the at least one aperture, yet leaving portions of the sacrificial layer at locations farthest from the aperture, thereby defining anchor structures, and closing the aperture in a top portion of the semiconductor membrane layer to form a membrane over a remaining portion of the aperture.

* * * * *